United States Patent [19]

Chiu

[11] Patent Number: 4,994,402

[45] Date of Patent: Feb. 19, 1991

[54] METHOD OF FABRICATING A COPLANAR, SELF-ALIGNED CONTACT STRUCTURE IN A SEMICONDUCTOR DEVICE

[75] Inventor: Kuang-Yi Chiu, Los Altos Hills, Calif.

[73] Assignee: Hewlett-Packard Company, Palo Alto, Calif.

[21] Appl. No.: 400,609

[22] Filed: Aug. 30, 1989

Related U.S. Application Data

[63] Continuation-in-part of Ser. No. 67,509, Jun. 26, 1987.

[51] Int. Cl.$^5$ .................. H01L 21/283; H01L 21/285; H01L 21/76
[52] U.S. Cl. ...................... 437/41; 437/192; 437/193; 437/195; 437/200; 437/228
[58] Field of Search ............... 437/41, 192, 193, 195, 437/200, 228; 148/DIG. 19, DIG. 141, DIG. 147; 156/657, 659.1, 661.1, 644

[56] References Cited

U.S. PATENT DOCUMENTS

| | | | |
|---|---|---|---|
| 4,208,781 | 6/1980 | Rao et al. | 437/195 |
| 4,333,225 | 6/1982 | Yeh | 437/195 |
| 4,384,399 | 5/1983 | Kuo | 437/195 |
| 4,402,126 | 9/1983 | Chapman | 437/195 |
| 4,443,930 | 4/1984 | Hwang et al. | 437/41 |
| 4,462,149 | 7/1984 | Schwabe | 437/200 |
| 4,767,724 | 8/1988 | Kim et al. | 437/194 |
| 4,788,160 | 11/1988 | Havemann et al. | 437/200 |
| 4,822,749 | 4/1989 | Flanner et al. | 437/41 |
| 4,826,786 | 5/1989 | Merenda et al. | 437/195 |

FOREIGN PATENT DOCUMENTS

| | | | |
|---|---|---|---|
| 53-29088 | 3/1978 | Japan | 437/193 |
| 53-105989 | 9/1978 | Japan | 437/193 |
| 57-4141 | 1/1982 | Japan | 437/193 |
| 62-128546 | 6/1987 | Japan | 437/200 |
| WO83/02197 | 6/1983 | PCT Int'l Appl. | 437/193 |
| 2062959 | 5/1981 | United Kingdom | 437/200 |

OTHER PUBLICATIONS

Ho et al., J. Vac. Sci. Technol. A5 (4) (Jul./Aug. 1987), pp. 1396–1401.

Primary Examiner—Olik Chaudhuri
Attorney, Agent, or Firm—Herbert R. Schulze

[57] ABSTRACT

A method of fabricating a coplanar, self-aligned contact structure in a semiconductor device. Polysilicon pads are placed on top of field oxide regions which adjoin source and drain diffusion regions of the device. Strips of highly conductive material such as titanium silicide or titanium nitride are formed on top of each pad; each strip extends down a side of its pad to an adjoining diffusion region, thereby establishing a conductive path between the diffusion region and the top of the pad. Contacts are established by etching holes through a passivation layer which covers the device to reach the conductive strips on top of the pads.

13 Claims, 17 Drawing Sheets

FIG_1 (PRIOR ART)

FIG_2 (PRIOR ART)

FIG_3

FIG_4

FIG_5

FIG_6

FIG_7

FIG_8

FIG_9

FIG_10

FIG_11

FIG_12

FIG_13

FIG_14

FIG_15

FIG_16

METHOD OF FABRICATING A COPLANAR, SELF-ALIGNED CONTACT STRUCTURE IN A SEMICONDUCTOR DEVICE

CROSS-REFERENCE TO RELATED APPLICATION

This is a continuation-in-part of co-pending U.S. patent application Ser. No. 07/067,509, filed June 26, 1987 and assigned to the same assignee as the assignee of this application.

BACKGROUND OF THE INVENTION

This invention relates generally to semiconductor devices and more particularly to a method of fabricating a coplanar, self-aligned contact structure in a semiconductor device.

In recent years the advancement of very large scale integration ("VLSI") technology has resulted in a need to fit more and more individual semiconductor devices such as transistors into smaller and smaller areas of an integrated circuit chip. The dimensions of these devices have reached the submicron range, and it has become increasingly difficult to make low-resistance contacts for interconnecting such devices. Among the difficulties which have been encountered are spiking through shallow source and drain junction regions and various contact etch stop problems.

Figure 1:
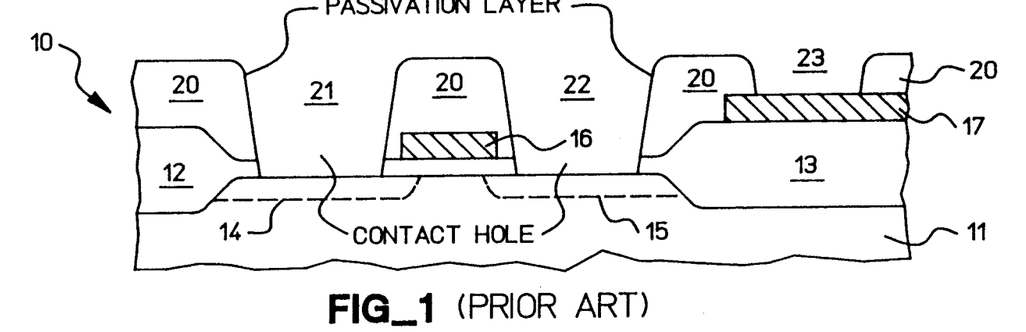
FIG. 1 is an enlarged sectional view of a semiconductor device being fabricated according to a prior art method and shown prior to application of an upper metal layer.

An integrated circuit semiconductor fabricated according to typical prior art methods is shown in FIG. 1. A device such as a MOSFET transistor generally designated 10 is constructed on a silicon substrate 11. Spaced-apart first and second field oxide layers 12 and 13 are formed on the substrate 11. Between the layers 12 and 13, a source diffusion region 14 of the substrate 11 abuts the first layer 12 and a drain diffusion region 15 abuts the second layer 13. A gate 16, for example of polysilicon, overlies parts of the source and drain regions 14 and 15 and another portion of the substrate 11 which lies between said regions.

A first extremity of a polysilicon layer 17 overlies a portion of the field oxide layer 13, the layer 17 having a second extremity which extends out of the field of view of FIG. 1, for example to define a gate of an adjacent semiconductor. A passivation layer 20 such as phosphosilicate glass overlies the entire structure. During the manufacturing process, source and drain contact holes 21 and 22 are etched through the passivation layer 20 to the source and drain diffusion regions 14 and 15, respectively, and a contact hole 23 is etched through the layer 20 to the polysilicon layer 17.

Figure 2:
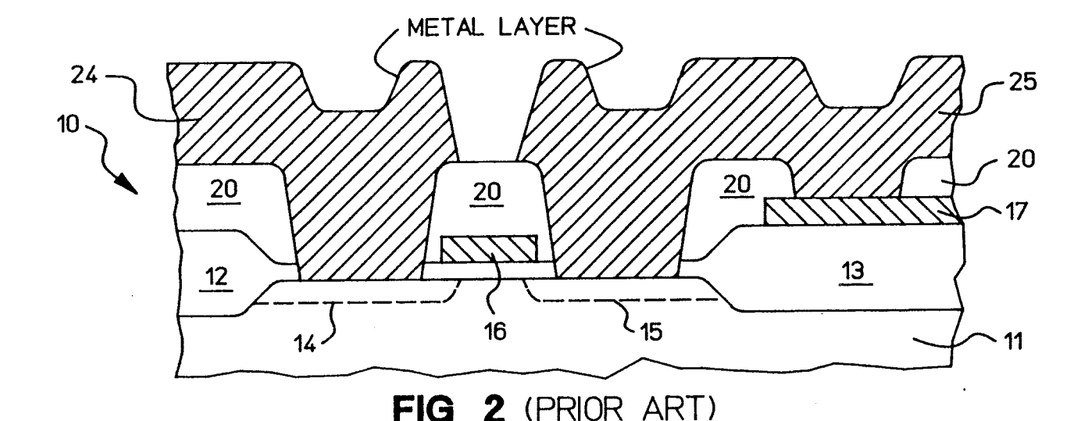
FIG. 2 shows the same device as FIG. 1 after the metal layer has been applied.

Next, a metal layer such as an aluminum alloy is deposited on top of the device of FIG. 1, resulting in the device shown in FIG. 2. The metal layer is deposited over the device and then etched to provide a first contact 24 through the hole 21 to the source region 14 and a second contact 25 through the holes 22 and 23 to establish a direct connection between the drain region 15 and the polysilicon layer 17.

As the overall dimensions of devices such as the transistor 10 became smaller, defects which could result from lithographic misalignment and undercutting during contact etch were avoided by increasing the spacing between the contact holes 21 and 22 and the edges of the gate 16 and the oxide regions 12 and 13. Not only did this increased spacing limit the number of devices which could be placed on a chip but it also increased the junction capacitances and contact resistances, thereby degrading performance of the device.

Efforts to improve device performance by reducing these spacings led to very shallow junctions at the diffusion regions 14' and 15 and often resulted in spiking problems in which the metal 24 and 25 penetrated through the diffusion regions to the substrate 11 below. Etch stop problems arose from tighter controls of the device geometry and a need for planarization of the tops of the metal contacts.

Methods such as reflow, salicide and planarization have been tried in a continuing effort to solve these problems. However, as the device dimensions have shrunk into the submicron range, these methods have been inadequate to solve all of the problems simultaneously. Accordingly there remains a need for a way to fabricate low-resistance contacts in semiconductor devices having dimensions in the submicron range without suffering the ill effects of junction spiking, high junction capacitance and contact etch stop problems.

SUMMARY OF THE INVENTION

The present invention provides a method of forming a coplanar, self-aligned semiconductor contact structure in a semiconductor device having dimensions as small as the submicron range. Contact resistance and junction capacitance are low and adverse effects such as junction spiking and contact etch stop problems are avoided.

According to the method of the invention, polysilicon pads are placed on top of field oxide regions which adjoin source and drain diffusion regions of the semiconductor substrate. Next, strips of highly conductive material are formed on top of each pad; each strip extends down a side of its pad to the adjoining diffusion region, thereby establishing a conductive path between the diffusion region and the top of the pad. In a later stage of the fabrication, contacts are established with the strips on top of the pads, thereby avoiding any need to etch down to the diffusion regions or to deposit metal contacts directly onto these regions.

More particularly, the method of the invention includes the steps of forming first and second field oxide regions in the surface of a substrate; forming a gate oxide layer in an island between the field oxide regions; forming first and second coplanar polysilicon pads on the first and second oxide regions; forming a source diffusion region between the gate and the first oxide region and a drain diffusion region between the gate and the second oxide region; coating the pads and the substrate with a refractive metal; coating the metal with a reactive layer; using the metal and the reactive layer to form a pair of conductors, one extending between the source region and the first pad and the other extending between the drain region and the second pad; and establishing electrical contacts with the conductors on top of the pads.

In one embodiment the conductors are formed by etching the reactive layer to form a first strip overlying the first pad and extending over part of the source region and a second strip overlying the second pad and extending over part of the drain region, and annealing to form the conductors. The reactive layer is preferably amorphous silicon.

The annealing is preferably done in stages. The first stage includes annealing at a relatively low temperature to react the metal with the silicon at locations where the metal is covered with silicon and with the underlying source and drain regions at locations where the metal is not covered with silicon. Any unreacted metal is then removed. Finally, the reaction is completed by annealing at a relatively high temperature.

In another embodiment the conductors are formed by annealing at a relatively low temperature to form a nitride over the oxide regions and a silicon compound over the silicon regions, etching to form the conductive strips, and annealing at a relatively high temperature. Preferably the metal is titanium and the reactive layer is titanium nitride.

The pads are created, for example, by forming a polysilicon layer over the island region and part of each field oxide region and then etching the polysilicon and the underlying gate oxide.

Preferably the diffusion regions are formed by coating the pads and substrate with a dielectric layer, directionally etching the layer to provide oxide spacers around the pads, and creating the diffusion regions by ion implantation and drive-in.

In one embodiment the electrical contacts are established by forming a passivation layer over the conductors, making holes through the layer over the pads, and depositing metal in the holes to make contact with the conductors at the bottoms of the holes.

In another embodiment the semiconductor, except the portions of the conductors which lie on top of the pads, is covered with a first dielectric layer, the entire structure is then covered with a second dielectric layer, holes are made through the second layer over the pads, and metal is deposited to make contact with the conductors. The first layer is formed by, for example, covering the entire structure, spinning on photoresist, and etching to planarize the layer down to the level of the conductors which overlie the pads. An etchant that acts faster on the second layer than on the first is used to make the holes. No harm is done if, through inadvertence or design, a contact hole turns out to be wider than the pad beneath.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

As shown in the drawings for purposes of illustration, the invention is embodied in a method of fabricating a coplanar, self-aligned contact structure in a semiconductor device having dimensions as small as the submicron range.

There has been a continuing effort to fit more and more semiconductor devices onto an integrated circuit chip. As the overall device dimensions have become smaller, defects resulting from lithographic misalignment and undercutting during contact etch have been avoided by increasing the spacing between contact holes and the edges of adjacent gate and oxide regions, but at the price of limiting device density and performance. Efforts to reduce these spacings so as to improve device performance by lowering junction capacitance and contact resistance have in turn let to junction spiking and etch stop problems. Methods such as reflow, salicide and planarization have been used in an effort to solve these difficulties, but as semiconductor device dimensions have shrunk into the submicron range these methods have been inadequate.

In accordance with the invention, a coplanar self-aligned contact structure is fabricated by forming coplanar polysilicon pads over field oxide regions of a semiconductor, placing conductive strips between the tops of the pads and adjacent diffusion regions, and establishing electrical contacts with the conductive strips on top of the pads rather than directly with the diffusion regions. The resulting contract structure has many advantages. Since no contact need be opened into the diffusion regions, junction spiking and contact degradation resulting from the etching of contact holes and from stresses associated with the placement of metal or other contact plug materials in the holes are avoided. All contacts are coplanar and are opened on polysilicon and field oxide, minimizing etch stop problems. There is no need for any planar isolation topology of the kind required in backend processing. There is but one registration error for all the contacts in all the semiconductors on the chip. Contact resistance and junction capacitance are low, thereby improving the performance of the semiconductor.

More particularly, FIGS. 3 through 12 illustrate successive stages in making a coplanar self-aligned contact structure according to a preferred embodiment of the invention. First and second field oxide regions 31 and 33 are formed in a planar surface 35 of a substrate 37 of semiconductor material such as silicon. The regions 31 and 33 are separated from each other by an island region 39 of the substrate 37, the regions 31, 33 and 39 together defining an area of the substrate 37 on which a semiconductor device will be fabricated.

A plurality of semiconductor devices are usually fabricated simultaneously on a semiconductor chip. Accordingly a third field oxide region 41, separated from the second region 33 by another island region 43 and defining part of an area on which a second semiconductor device will be fabricated, is formed at the same time as the regions 31 and 33. Other such regions are also formed at other locations on the substrate not shown in the drawings.

Figure 3:
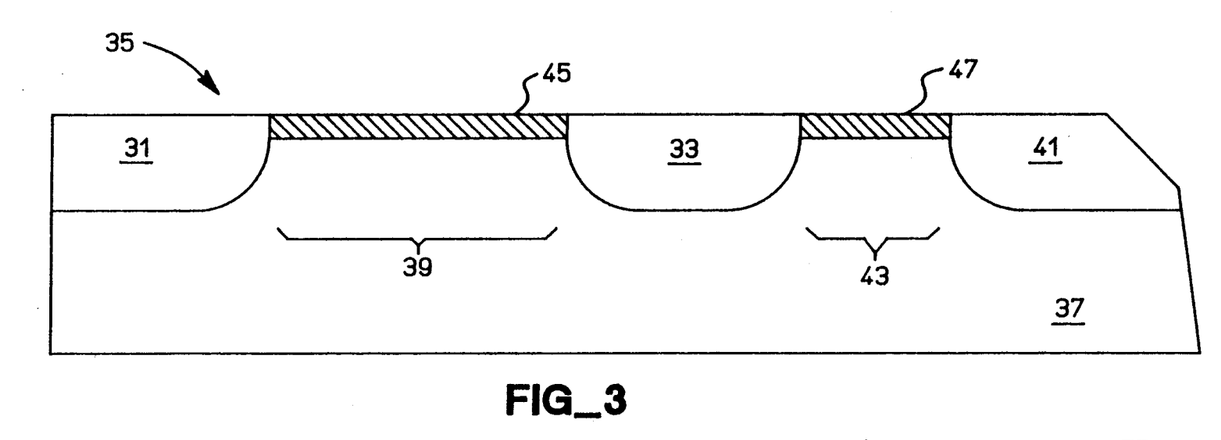
FIG. 3 is an enlarged sectional view of a semiconductor device being fabricated according to the method of the invention after the steps of forming field oxide regions and a gate oxide layer.
Figure 4:
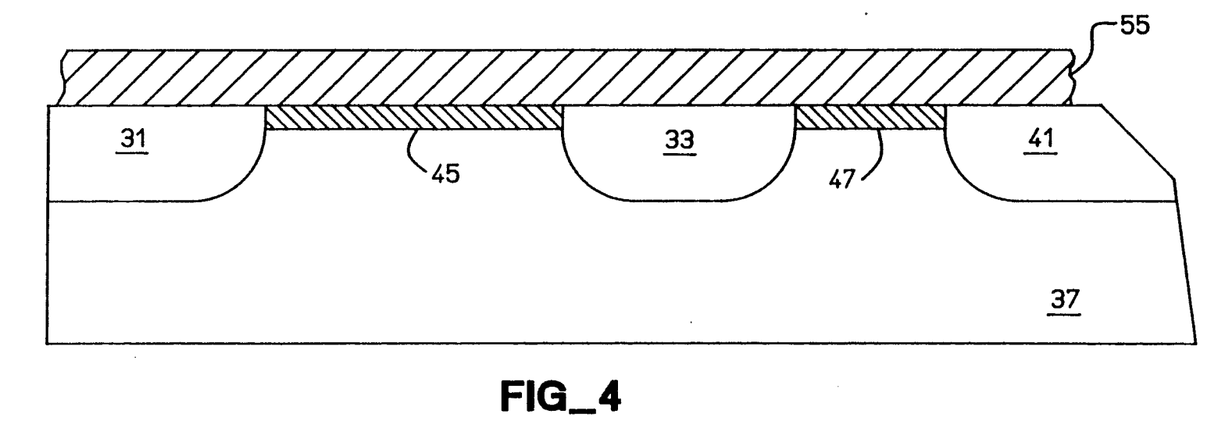
FIG. 4 shows the device of FIG. 3 after forming a polysilicon layer over the field oxide and island regions.

Next gate oxide layers 45 and 47 are formed in the planar surfaces of the islands 39 and 43, respectively, by thermal growth techniques or the like, resulting in the structure illustrated in FIG. 3. Then three coplanar polysilicon pads 49, 51 and 53 are formed, for example by forming a polysilicon layer 55 over the island regions 39 and 43 and a portion of each of the field oxide regions 31, 33 and 41 (as shown in FIG. 4) and etching the polysilicon layer 55 and the underlying gate oxide layer 45 by plasma etch or the like, resulting in the structure of FIG. 5.

Figure 5:
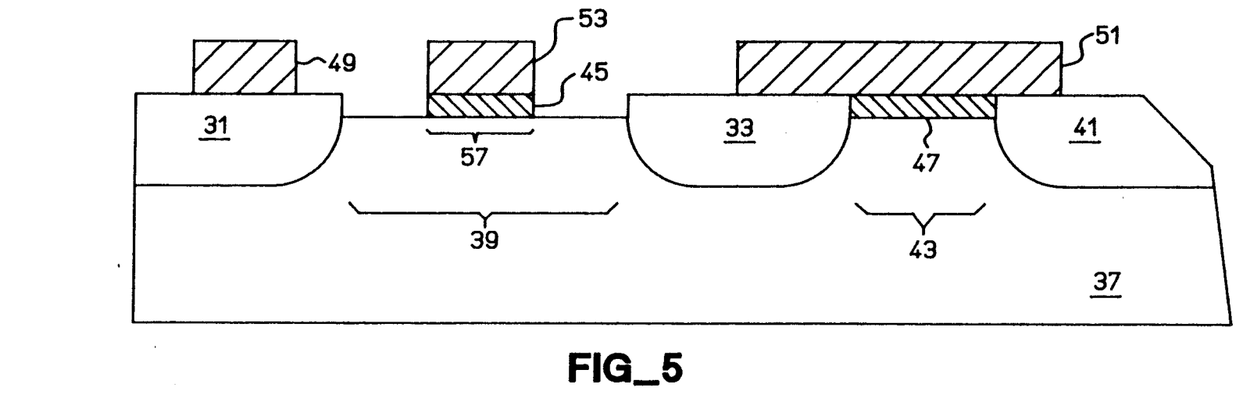
FIG. 5 shows the device of FIG. 4 after etching the polysilicon layer and the gate oxide layer to form pads.
Figure 6:
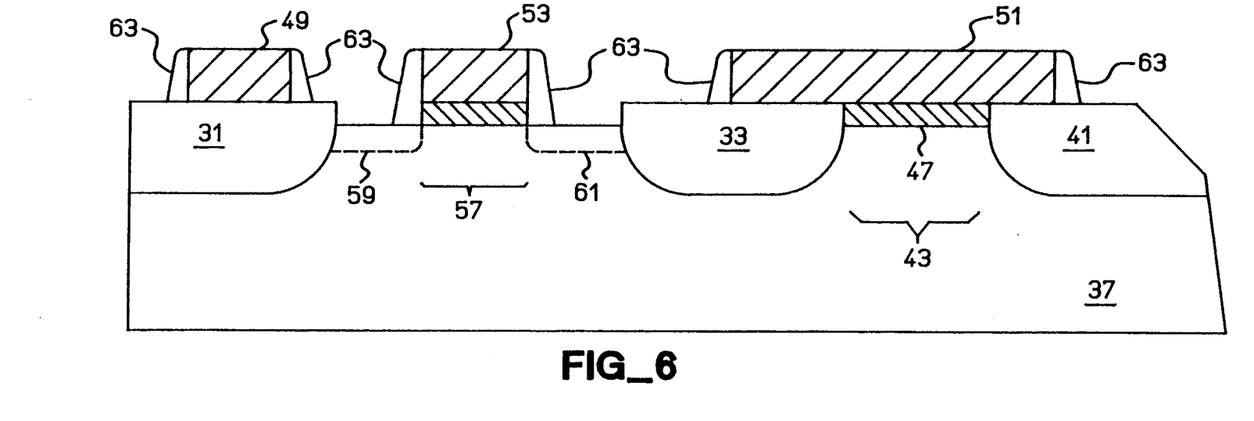
FIG. 6 shows the device of FIG. 5 after forming source and drain regions.

The first pad 49 overlies part of the first field oxide region 31, the second pad 51 overlies part of the second field oxide region 33 and the third pad 53 overlies part of the gate oxide layer 45 within the island region 39 to define a gate region 57, the remainder of the oxide layer 45 within the island region 39 having been removed by the etch. The second pad 51 extends from the second oxide region 33 across the island region 43 to cover a portion of the third field oxide region 41.

Next, a source diffusion region 59 is formed in the island region 39 between the gate region 57 and the first field oxide region 31, and a drain diffusion region 61 is formed in the island region 39 between the gate region 57 and the second field oxide region 33. The diffusion regions are preferably formed by coating the pads 49, 51 and 53 and the substrate surface 35 between the pads with a dielectric layer (not shown), directionally etching the dielectric layer to provide oxide spacers 63 around the pads, and performing ion implantation and drive-in to form the diffusion regions 59 and 61, resulting in the structure shown in FIG. 6.

Figure 7:
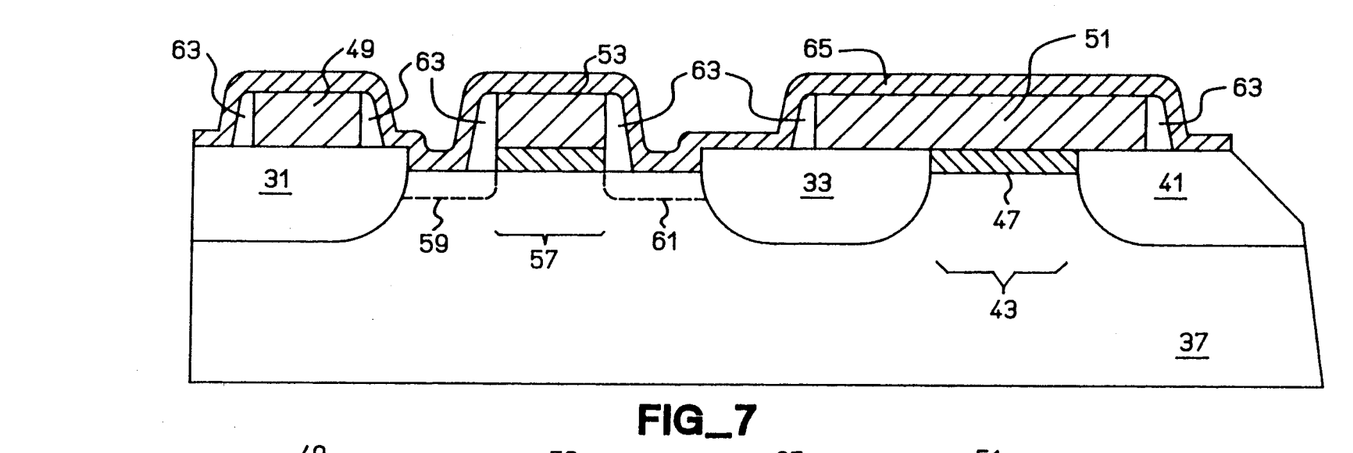
FIG. 7 shows the device of FIG. 6 after coating with a refractive metal.
Figure 8:
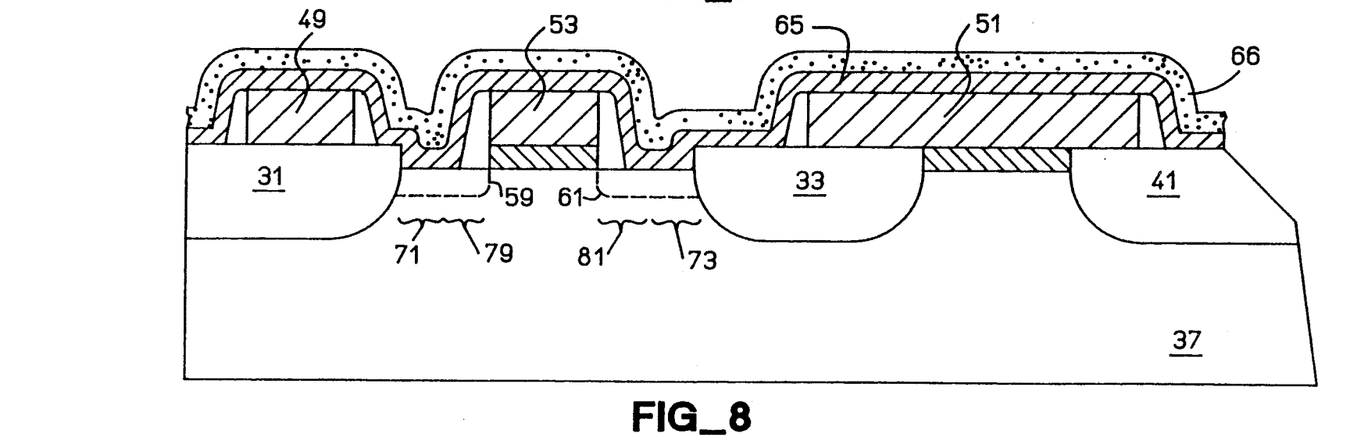
FIG. 8 shows the device of FIG. 7 after coating with a reactive layer.

The next step is to coat the pads 49, 51 and 53 and the exposed surface of the substrate 37 with a refractive metal 65 such as tungsten, titanium, cobalt, nickel or molybdenum or a noble metal such as platinum or palladium, as shown in FIG. 7, and then in turn to cover the metal 65 with a reactive layer 66 such as amorphous silicon, as shown in FIG. 8.

The metal 65 and the layer 66 of amorphous silicon are preferably sputter-deposited sequentially in a single pumpdown to minimize the formation of interfaced oxide which might otherwise retard the formation of silicide, to be described in a subsequent step. The layer 66 is thick enough to fully react with the underlying metal 65 during formation of the silicide.

Figure 9:
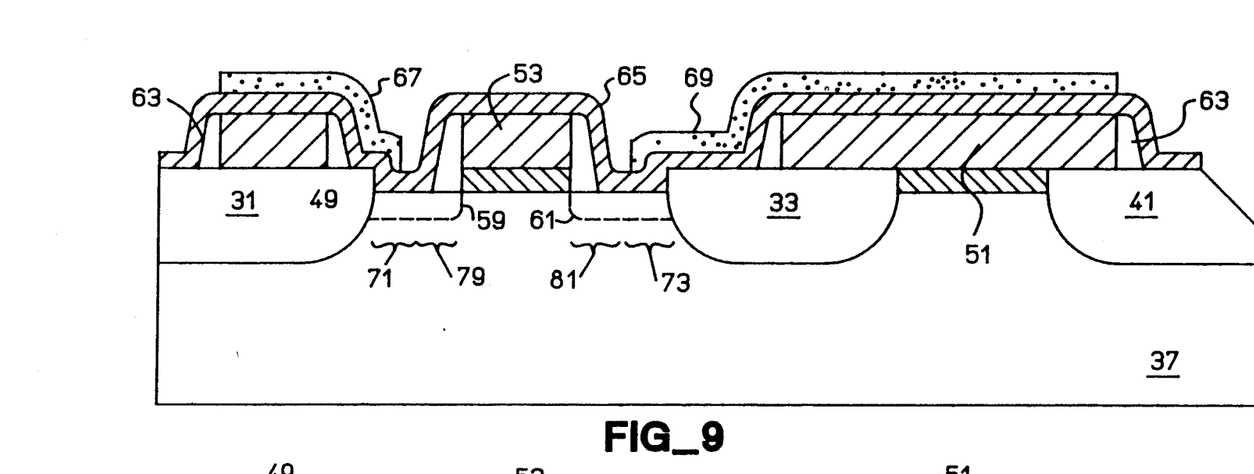
FIG. 9 shows the device of FIG. 8 after the reactive layer has been etched to form strips prior to annealing.

Next the layer 66 is etched to form a first strip 67 overlying the first pad 49 and extending therfrom to and over a first portion 71 of the source region 59 and a second strip 69 overlying the second pad 51 and extending therefrom to and over a first portion 73 of the drain region 61, as best shown in FIG. 9. This etch is preferably carried out by coating the layer 66 with photoresist, exposing the photoresist in the desired pattern, and etching using a fluorine-based plasma ambient characterized by high selectivity to the metal 65 whereby the metal 65 is relatively unaffected by the etching.

Figure 10:
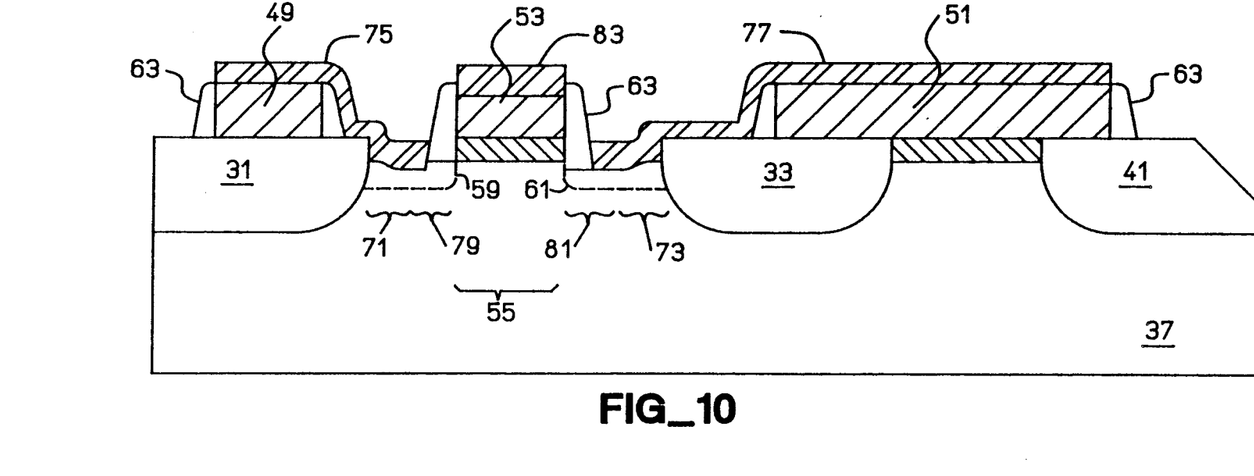
FIG. 10 shows the device of FIG. 9 after forming conductors.

Then the metal 65 is reacted with the strips 67 and 69 and the substrate to form first and second silicide conductors 75 and 77 in electrical contact with the source and drain regions 59 and 61, respectively, as best shown in FIG. 10.

The reaction between metal and silicon is preferably carried out by annealing at a relatively low temperature to react that portion of the metal having a covering of amorphous silicon with the amorphous silicon and to react that portion of the metal having no covering of amorphous silicon and which covers the source and drain regions of the silicon substrate with the substrate. Then any unreacted metal is removed and the annealing is completed at a relatively high temperature.

More particularly, during the reaction those portions of the metal which are covered by amorphous silicon react therewith to form conducting silicide and those portions of the metal which are not covered by amorphous silicon react instead with any underlying silicon to form conducting silicide. The metal which overlies the first portion 71 of the source region 59 has a covering of amorphous silicon and reacts therewith, and the metal which overlies a second portion 79 of the source region 59 has no covering of amorphous silicon and instead reacts with the surface of the region 59. The result is the silicide conductor 75 which is in good electrical contact with the source region 59 and which extends from the source region 59 to and over the top of the pad 49.

Similarly, the metal which overlies the first portion 73 of the drain region 61 has a covering of amorphous silicon and reacts therewith, and the metal which overlies a second portion 81 of the drain region 61 has no covering of amorphous silicon and instead reacts with the surface of the drain region 61. The result is the silicide conductor 77 which is in good electrical contact with the drain region 61 and which extends to and over the top of the pad 51.

The metal which overlies the third pad 53 has no covering of amorphous silicon and so reacts with the top portion of the pad 53 to form a silicide 83; however, the metal which covers the oxide spacers 63 on the sides of the pad 53 has no underlying or overlying silicon with which to react and hence remains unreacted. This unreacted metal (which is not shown in FIG. 10) is removed as mentioned above prior to the second annealing.

Figure 11:
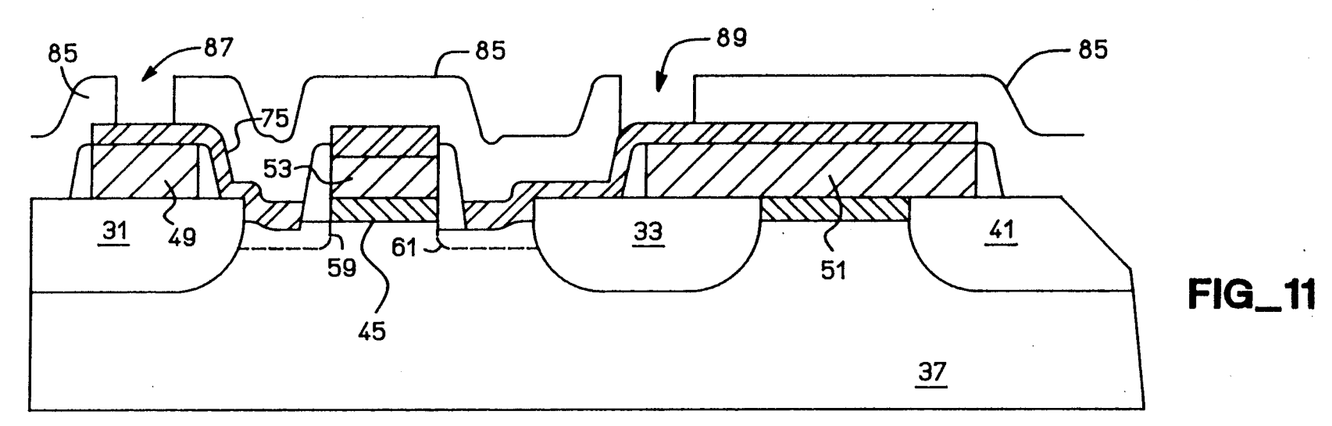
FIG. 11 shows the device of FIG. 10 after forming a passivation layer over the conductors and making holes through said layer.
Figure 12:
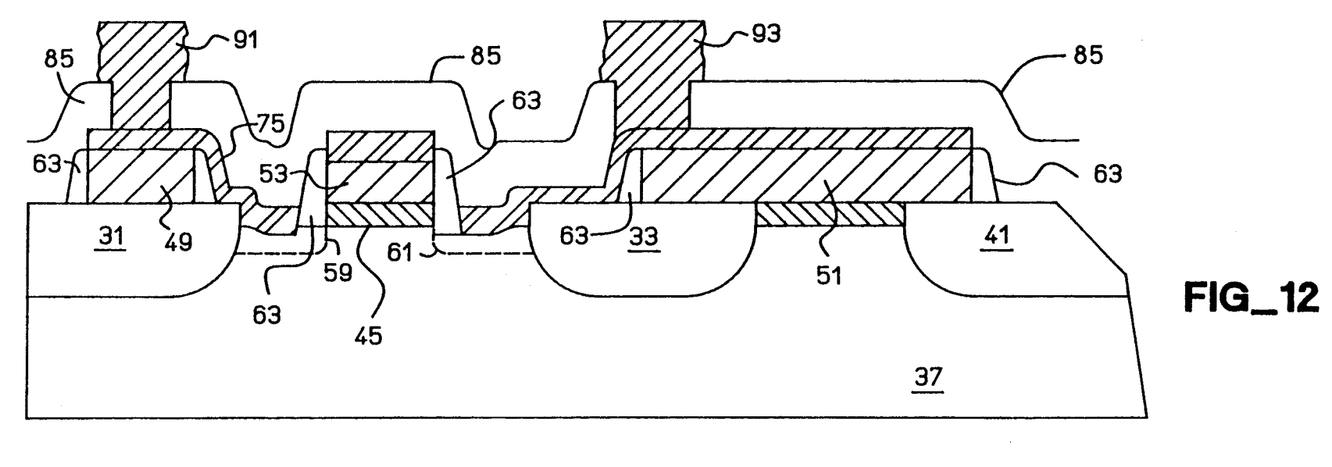
FIG. 12 shows the device of FIG. 11 after depositing metal in the holes.

Finally, electrical contacts are established with the portions of the conductors 75 and 77 that cover the pads 49 and 51. In one embodiment of the invention this is accomplished by forming a passivation layer 85 over the conductors 75 and 77 and making a first hole 87 through the passivation layer 85 over the first pad 49 to the first conductor 75 and a second hole 89 through the layer 85 over the second pad 51 to the second conductor 77 as shown in FIG. 11. Then metal plugs 91 and 93 are deposited in the holes 87 and 89, respectively, to establish electrical contact with the conductors at the bottom of the holes as shown in FIG. 12.

As noted previously, a plurality of semiconductor devices are fabricated at the same time on various portions of the substrate 37. From the above discussion it will be apparent that conducting silicide strips which establish electrical contacts with source, drain and gate regions of these various devices will all extend over the tops of polysilicon pads similar to the pads 49, 51 and 53 and hence are all coplanar. Thus, a single etch through the passivation layer 85 to a single depth is all that is needed to make holes through which metal contacts can be inserted to reach all of these various conductors; this avoids problems which have been experienced in the past as a result of having to do differential etches to reach conducting parts of the devices at various depths.

Figure 13:
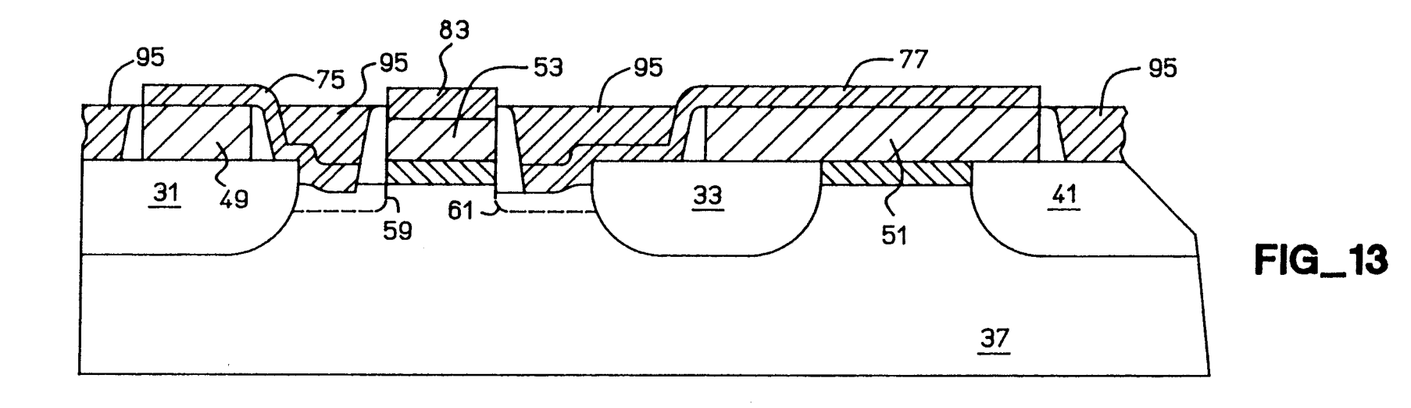
FIG. 13 shows the device of FIG. 10 after covering the device with a first dielectric layer according to an alternate embodiment of the invention.
Figure 14:
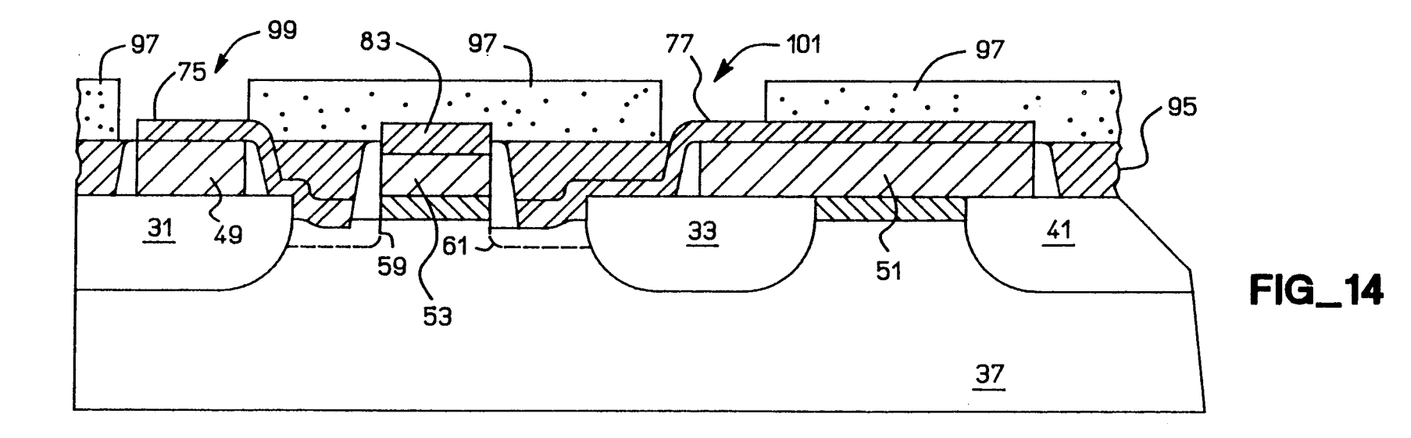
FIG. 14 shows the device of FIG. 13 after covering the device with a second dielectric layer and making holes through said layer.
Figure 15:
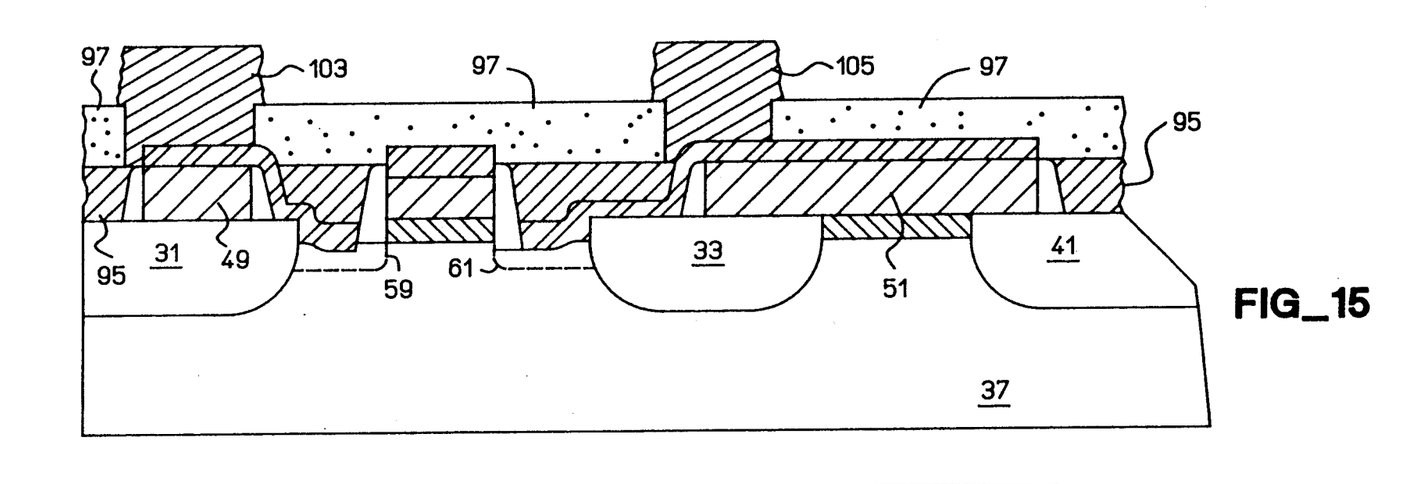
FIG. 15 shows the device of FIG. 14 after depositing metal in the holes.

In an alternate embodiment the electrical contacts with the conductors 75 and 77 are formed by covering the device of FIG. 10 (except the portions of the conductors 75 and 77 which overlie the pads 49 and 51) with a first dielectric layer 95, as shown in FIG. 13. Next the layer 95 and the exposed portions of the conductors 75 and 77 are covered with a second dielectric layer 97. Then a first hole 99 is opened through the second layer 97 over the first pad 49 to the first conductor 75 and a second hole 101 is opened through the second layer 97 over the second pad 51 to the second conductor 77, the holes 99 and 101 being of similar depth as shown in FIG. 14. Finally, metal is deposited in the holes 99 and 101 to establish electrical contacts 103 and 105 with the conductors 75 and 77, respectively, at the bottoms of the holes as shown in FIG. 15.

The first dielectric layer 95 is preferably formed by covering the entire semiconductor with suitable dielectric material, spinning a thick photoresist thereover, and etching back to planarize the dielectric layer down to the level of the portions of the conductors 75 and 77 which overly the pads. A suitable material for the first dielectric layer is, for example, a low temperature oxide such as phosphosilicate glass, borosilicate phosphate glass, TEOS, or a nitride.

The second dielectric layer may be formed of material such as a polyimide, a plasma-enhanced nitride, or a spin-on glass.

The holes 99 and 101 are preferably formed by etching with an etchant that acts at least ten times more rapidly on the second dielectric layer 97 than on the first dielectric layer 95 so that the conductors 75 and 77 are exposed without damaging other parts of the semiconductor.

The alignment of the holes 99 and 101 is not critical, and no ill effects are suffered if one of the holes is wider than the pad which lies beneath it or is slightly misaligned with respect thereto. Accordingly, one or both holes can intentionally be made wider than the underlying pads if desired.

Fabrication of a semiconductor device according to an alternate embodiment of the invention will now be described. In this alternate embodiment, the conductors 75 and 77 are formed from a reactive layer which comprises titanium nitride rather than amorphous silicon. The technique of fabricating a semiconductor by depositing titanium nitride over titanium, and the advantages of this technique, are described in detail in a patent application titled "Method of Fabricating a Semiconductor Device by Capping a Conductive Layer with Titanium Nitride" co-invented by Martin S. Wang and the inventor of the present invention, which patent application has been assigned to the same assignee as the assignee of the present patent application and which is being filed contemporaneously herewith.

Figure 16:
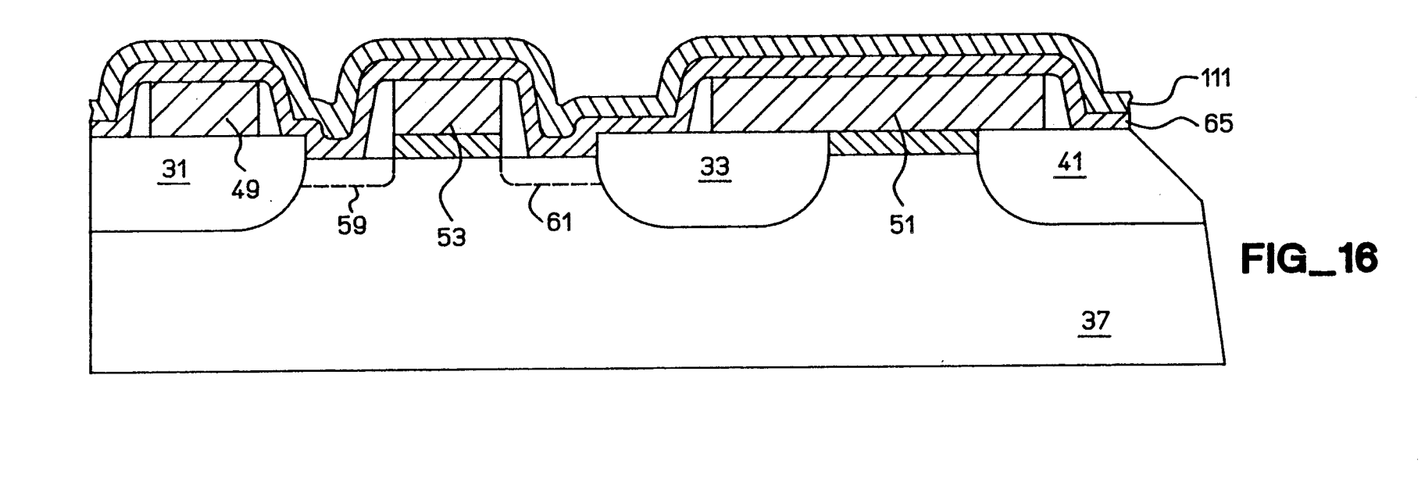
FIG. 16 shows the device of FIG. 7 after coating with a reactive layer such as titanium nitride according to an alternate embodiment of the invention.

The fabrication of a semiconductor device according to this alternate embodiment proceeds as described above until the metal 65 has been deposited as shown in FIG. 7. Next, a reactive layer 111, comparable to the layer 66 of FIG. 8, is deposited over the structure as shown in FIG. 16. The metal 65 preferably comprises titanium and the reactive layer 111 preferably comprises titanium nitride.

Figure 17:
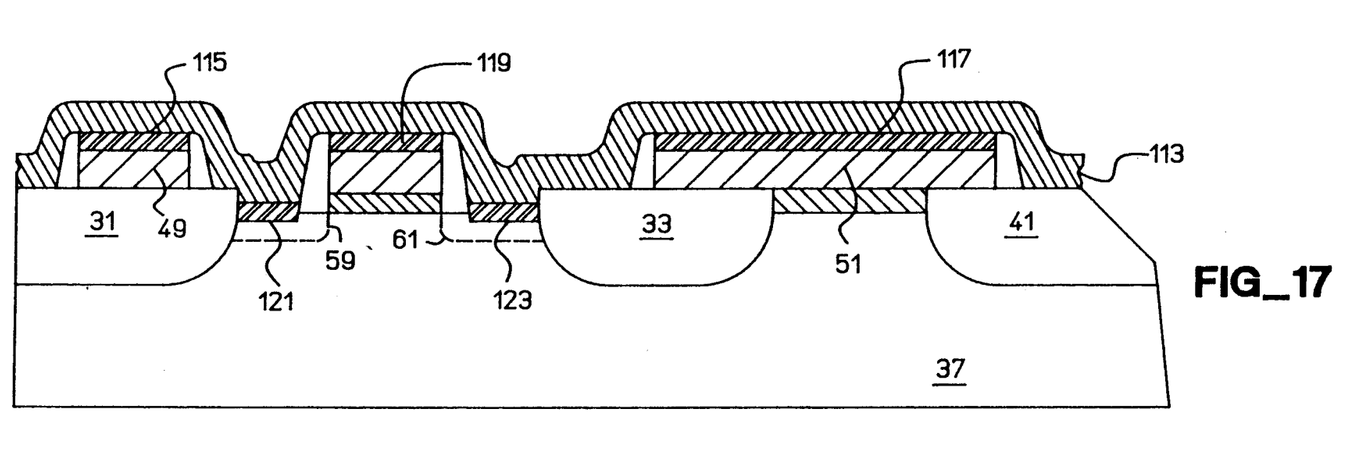
FIG. 17 shows the device of FIG. 16 after annealing at a low temperature.

After deposit of the layer 111, the structure is annealed at a relatively low temperature in an ambient atmosphere of nitrogen. During this annealing the metal 65 and the reactive layer 111 are combined into a single titanium nitride layer 113 which covers the entire structure, as best shown in FIG. 17. In addition, any silicon which is covered by the metal 65 reacts with the metal to form a silicon compound such as titanium silicide.

In particular, the upper surface of the pad 49 reacts with the metal to form a titanium silicide layer 115 which covers the pad 49 and lies beneath the titanium nitride layer 113. Similarly, the surface of the pad 51 reacts with the metal to form a titanium silicide layer 117; the surface of the pad 53 reacts with the metal to form a titanium silicide layer 119; the surface of the source region 59 reacts with the metal to form a titanium silicide layer 121; and the surface of the drain region 61 reacts with the metal to form a titanium silicide layer 123.

Figure 18:
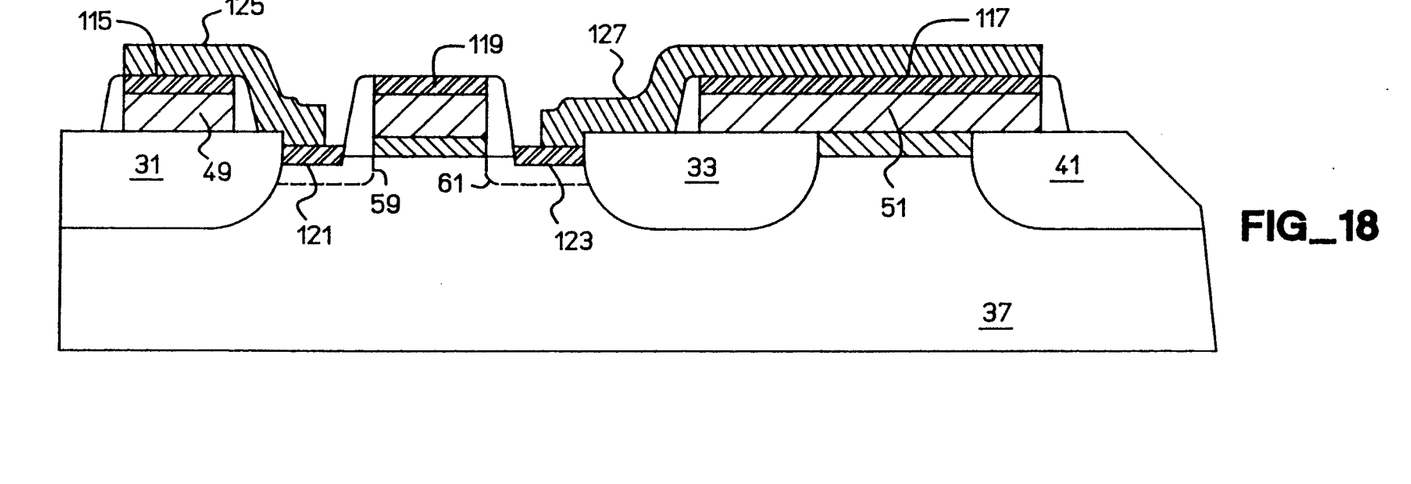
FIG. 18 shows the device of FIG. 17 after etching to form the conductors.

After the low temperature annealing, the layer 113 is etched to form the conducting strips, for example by applying and exposing a photoresist mask and utilizing a dry etch. Then a second anneal is done at a relatively high temperature. The resulting structure is shown in FIG. 18. A first conductor 125 of titanium nitride, comparable to the conductor 75 of the embodiment depicted in FIG. 10, extends from the top of the first pad 49 to the source region 59, and a second conductor 127 of titanium nitride extends from the top of the second pad 51 to the drain region 61.

The conductor 125 is in intimate contact with the titanium silicide layer 121 in the surface of the source region 59, thereby establishing a highly conductive path between the source region 59 and the top of the first pad 49. Similarly the conductor 127 is in contact with the layer 123 in the surface of the drain region 61, establishing a conductive path between the drain region 61 and the top of the second pad 51.

Finally, electrical contacts are formed substantially as described previously, proceeding for example with deposit of a passivation layer such as the layer 85 of FIG. 11 or with deposit of a dielectric layer such as the layer 95 of FIG. 13.

From the foregoing it will be apparent that the present invention provides a method of fabricating a coplanar, self-aligned contact structure in a semiconductor device having dimensions as small as the submicron range. Devices embodying the invention can be made very small without the adverse effects of lithographic misalignment and undercutting during contact etch, permitting dense packing of the devices on an integrated circuit chip. Contact resistance and junction capacitance are low, and such problems as junction spiking and contact etch stop difficulties are avoided.

Although certain specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

I claim:

1. A method of forming a coplanar self-aligned contact structure in a semiconductor device, the method comprising:

forming first and second field oxide regions in a planar surface of a substrate, the regions being separated from each other by an island region of the substrate;

forming a gate oxide layer in the planar surface of the island region;

forming three coplanar polysilicon pads, a first such pad overlying the first field oxide region, a second such pad overlying the second field oxide region and a third such pad overlying the gate oxide layer to define a gate region;

forming in the island region a source diffusion region between the gate region and the first field oxide region and a drain diffusion region between the gate region and the second field oxide region;

coating the pads and the substrate with a refractive metal;

coating the metal with a reactive layer;

forming first and second conductors from the metal and the reactive layer, the first and second conductors being in electrical contact with the source and drain regions, respectively, and extending therefrom to and over the first and second pads; and establishing electrical contacts with the portions of the conductors which cover the pads.

2. A method according to claim 1 wherein the step of forming the conductors comprises:

etching the reactive layer to form a first strip overlying the first pad and extending therefrom to and over a portion of the source region and a second strip overlying the second pad and extending therefrom to and over a portion of the drain region; and annealing to form the conductors.

3. A method according to claim 2 wherein the reactive layer comprises amorphous silicon.

4. A method according to claim 3 wherein the annealing step comprises:

annealing at a relatively low temperature to react that portion of the metal which is covered by the amorphous silicon strips with the amorphous silicon and to react that portion of the metal which covers the source and drain regions of the substrate and which is not covered by the amorphous silicon with the substrate;

removing any unreacted metal; and annealing at a relatively high temperature.

5. A method according to claim 1 wherein the step of forming the conductors comprises:

annealing at a relatively low temperature to form a nitride over oxide portions of the device and a silicon compound over silicon portions;

etching to form a first conducting strip overlying the first pad and extending therefrom to and over a portion of the source region and a second strip overlying the second pad and extending therefrom to and over a portion of the drain region; and annealing at a relatively high temperature.

6. A method according to claim 5 wherein the refractory metal comprises titanium and the reactive layer comprises titanium nitride.

7. A method according to claim 1 wherein the step of forming the diffusion regions comprises:

coating the pads and the substrate with a dielectric layer;

directionally etching the dielectric layer to provide oxide spacers around the pads; and performing ion implantation and drive-in to form the diffusion regions.

8. A method according to claim 1 wherein the step of forming the three pads comprises forming a polysilicon layer over the island region and a portion of each of the field oxide regions and etching the polysilicon layer and the underlying gate oxide layer.

9. A method according to claim 1 wherein the step of establishing electrical contacts comprises:

forming a passivation layer over the conductors;

making a first hole through the passivation layer over the first pad to the first conductor and a second hole through the passivation layer over the second pad to the second conductor, the holes being of similar depth; and depositing metal in each hole to establish an electrical contact with the conductor at the bottom of the hole.

10. A method according to claim 1 wherein the step of establishing electrical contacts comprises:

covering the semiconductor, except the portions of the conductors which overlie the pads, with a first dielectric layer;

covering the first layer and the exposed portions of the conductors with a second dielectric layer;

making a first hole through the second dielectric layer over the first pad to the first conductor and a second hole through the second dielectric layer over the second pad to the second conductor, the holes being of similar depth; and depositing metal in each hole to establish an electrical contact with the conductor at the bottom of the hole.

11. A method according to claim 10 wherein the step of covering the semiconductor with the first dielectric layer comprises covering the entire semiconductor with the first delectric layer, spinning a thick photoresist over the first dielectric layer, and etching back to planarize the dielectric layer down to the level of the portions of the conductors which overly the pads.

12. A method according to claim 10 wherein the step of making the holes comprises etching with an etchant that acts at least ten times more rapidly on the second dielectric layer than on the first dielectric layer.

13. A method according to claim 10 wherein one of the holes is wider than the pad which is beneath it.

* * * * *